US009461187B2

(12) United States Patent
Lim

(10) Patent No.: US 9,461,187 B2
(45) Date of Patent: Oct. 4, 2016

(54) SOLAR CELL APPARATUS AND METHOD FOR MANUFACTURING THE SAME

(75) Inventor: Chin Woo Lim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 459 days.

(21) Appl. No.: 13/982,366

(22) PCT Filed: Nov. 21, 2011

(86) PCT No.: PCT/KR2011/008875
§ 371 (c)(1),
(2), (4) Date: Aug. 28, 2013

(87) PCT Pub. No.: WO2012/102470
PCT Pub. Date: Aug. 2, 2012

(65) Prior Publication Data
US 2013/0327397 A1 Dec. 12, 2013

(30) Foreign Application Priority Data
Jan. 27, 2011 (KR) .................. 10-2011-0008468

(51) Int. Cl.
*H01L 31/0224* (2006.01)
*H01L 31/032* (2006.01)
*H01L 31/0392* (2006.01)
*H01L 31/0749* (2012.01)
*H01L 31/056* (2014.01)

(52) U.S. Cl.
CPC ... *H01L 31/022425* (2013.01); *H01L 31/0322* (2013.01); *H01L 31/03923* (2013.01); *H01L 31/056* (2014.12); *H01L 31/0749* (2013.01); *Y02E 10/52* (2013.01); *Y02E 10/541* (2013.01); *Y02P 70/521* (2015.11)

(58) Field of Classification Search
CPC .................. H01L 31/0224; H01L 31/022425; H01L 31/0322; H01L 31/03923; H01L 31/056; H01L 31/0749

USPC ........................................ 136/265
See application file for complete search history.

(56) References Cited

U.S. PATENT DOCUMENTS

| 2004/0063320 A1 | 4/2004 | Hollars |
| 2008/0251120 A1 | 10/2008 | Malmstrom et al. |
| 2008/0271781 A1 | 11/2008 | Kushiya et al. |
| 2010/0258191 A1 | 10/2010 | Mackie |

(Continued)

FOREIGN PATENT DOCUMENTS

| JP | 200680371 A | 3/2006 |
| JP | 2007528600 A | 10/2007 |
| KR | 10-2007-0100249 A | 10/2007 |

(Continued)

OTHER PUBLICATIONS

International Search Report in International Application No. PCT/KR2011/008875, filed Nov. 21, 2011.

(Continued)

*Primary Examiner* — Jayne Mershon
(74) *Attorney, Agent, or Firm* — Saliwanchik, Lloyd & Eisenschenk

(57) ABSTRACT

Disclosed are a solar cell apparatus and a method for manufacturing the same. The solar cell apparatus includes a substrate; a back electrode layer including molybdenum on the substrate; a light absorbing layer on the back electrode layer; and a window layer on the light absorbing layer, wherein the back electrode layer includes a first electrode layer on the substrate, a barrier layer on the first electrode layer and a second electrode layer on the barrier layer.

6 Claims, 2 Drawing Sheets

(56) References Cited

U.S. PATENT DOCUMENTS

2010/0300512 A1* 12/2010 Auvray ........... H01L 31/022425
            136/252
2010/0307575 A1    12/2010 Kim et al.
2011/0162696 A1*   7/2011 Vlcek ............. H01L 31/022425
            136/255

FOREIGN PATENT DOCUMENTS

| KR | 10-2010-0029414 A | 3/2010 |
| KR | 10-2010-0034817 A | 4/2010 |
| KR | 10-2011-0001821 A | 1/2011 |

OTHER PUBLICATIONS

Notice of Allowance dated Nov. 28, 2012 in Korean Application No. 10-2011-0008468, filed Jan. 27, 2011.

Scofield, J. H. et al. "Sputtered molybdenum bilayer back contact for copper indium diselenide-based polycrystalline thin-film solar cells" *Thin Solid Films*, 1995, 260:26-31.

Chinese Office Action dated Feb. 2, 2015 in Chinese Application No. 201180052958.X.

Office Action dated Jul. 14, 2015 in Japanese Application No. 2013-551887.

* cited by examiner

SOLAR CELL APPARATUS AND METHOD FOR MANUFACTURING THE SAME

CROSS-REFERENCE TO RELATED APPLICATIONS

This application is the U.S. national stage application of International Patent Application No. PCT/KR2011/008875, filed Nov. 21, 2011, which claims priority to Korean Application No. 10-2011-0008468, filed Jan. 27, 2011, the disclosures of each of which are incorporated herein by reference in their entirety.

TECHNICAL FIELD

The embodiment relates to a solar cell apparatus and a method for manufacturing the same.

BACKGROUND ART

Recently, as energy consumption is increased, a solar cell has been developed to convert solar energy into electrical energy.

In particular, a CIGS-based cell, which is a PN hetero junction apparatus having a substrate structure including a glass substrate, a metallic back electrode layer, a P type CIGS-based light absorbing layer, a high-resistance buffer layer, and an N type window layer, has been extensively used.

In addition, in order to manufacture such a solar cell apparatus, a patterning process must be performed to provide a plurality of cells.

DISCLOSURE OF INVENTION

Technical Problem

The embodiment provides a solar cell apparatus having improved efficiency with high productivity and a method for manufacturing the same.

Solution to Problem

A solar cell apparatus according to the embodiment includes a substrate; a back electrode layer including molybdenum on the substrate; a light absorbing layer on the back electrode layer; and a window layer on the light absorbing layer, wherein the back electrode layer includes a first electrode layer on the substrate, a barrier layer on the first electrode layer and a second electrode layer on the barrier layer.

A method for manufacturing the solar cell apparatus according to the embodiment includes the steps of forming a back electrode layer on a substrate; doping metallic elements different from materials forming the back electrode on the back electrode; forming a light absorbing layer on the back electrode layer; and forming a window layer on the light absorbing layer.

Advantageous Effects of Invention

The solar cell apparatus according to the embodiment can increase the open-circuit voltage (Voc) and the fill factor (FF), so that the photo-electro conversion efficiency of the solar cell can be improved.

In addition, since the charge concentration in the light absorbing layer can be improved, the thickness of the light absorbing layer can be reduced, so that the loss of transmitted light can be reduced.

MODE FOR THE INVENTION

Figure 1:
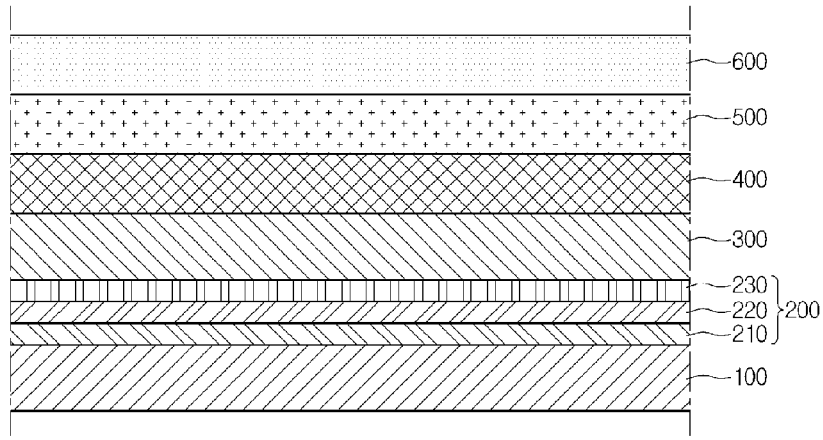
FIG. 1 is a sectional view showing a solar cell according to the embodiment.

In the description of the embodiments, it will be understood that, when a substrate, a layer, a film or an electrode is referred to as being on or under another substrate, another layer, another film or another electrode, it can be directly or indirectly on the other substrate, layer, film or electrode, or one or more intervening layers may also be present. Such a position of the layer has been described with reference to the drawings. The thickness and size of each layer shown in the drawings may be exaggerated, omitted or schematically drawn for the purpose of convenience or clarity. In addition, the size of elements does not utterly reflect an actual size.

FIG. 1 is a sectional view showing a solar cell according to the embodiment.

Referring to FIG. 1, a solar cell panel includes a support substrate 100, a back electrode layer 200 having a first electrode layer 210, a barrier layer 220 and a second electrode layer 230, a light absorbing layer 300, a buffer layer 400, a high-resistance buffer layer 500, and a window layer 600.

The support substrate 100 has a plate shape and supports the back electrode layer 200, the light absorbing layer 300, the buffer layer 400, the high-resistance buffer layer 500, and the window layer 600.

The support substrate 100 may include an insulating material. The support substrate 100 may be a glass substrate, a plastic substrate or a metal substrate. In detail, the support substrate 100 may be a soda lime glass.

If the soda lime glass substrate is used as the support substrate, sodium Na contained in soda lime glass may diffuse into the light absorbing layer 300 including CIGS material during the manufacturing process for the solar cell. In this case, the charge concentration in the light absorbing layer 300 may be increased, so that the photo-electro conversion efficiency of the solar cell can be improved.

However, if the sodium Na is not uniformly distributed over the whole area of the soda lime glass substrate, each cell may have no uniform photo-electro conversion efficiency, so the effect to improve the photo-electro conversion efficiency may be diminished. Thus, in order to uniformly dope the sodium Na, a barrier layer is formed on a substrate to block the Na diffusion and a uniform Na layer is additionally formed or Na ions are directly implanted.

Meanwhile, the support substrate 100 may include a ceramic substrate including alumina, a stainless steel substrate, or a polymer substrate having flexibility. The support substrate 100 may be transparent, flexible or rigid.

The back electrode layer 200 is disposed on the support substrate 100. The back electrode layer 200 is a conductive layer.

The back electrode layer 200 allows migration of charges generated from the light absorbing layer 300 of the solar cell such that current can flow out of the solar cell. To this end, the back electrode layer 200 may have high electric conductivity and low specific resistance.

In addition, since the back electrode layer 200 makes contact with the CIGS compound forming the light absorbing layer 300, an ohmic contact representing a low contact resistance value must be formed between the light absorbing layer 300 and the back electrode layer 200.

Further, the back electrode layer 200 must have the high-temperature stability when the heat treatment process is performed under the sulfide (S) or selenium (Se) atmosphere to form the CIGS compound. In addition, the back electrode layer 200 may have superior adhesive property with respect to the support substrate 100 in such a manner that the back electrode layer 200 may not be delaminated from the support substrate 100 due to difference of the thermal expansion coefficient.

The back electrode layer 200 may include one of Mo, Au, Al, Cr, W and Cu. Among the above elements, the Mo may satisfy the above properties required for the back electrode layer 200.

The back electrode layer 200 may include at least two layers. In this case, at least two layers may be formed by using the same metal or different metals. According to the embodiment, the back electrode layer 200 includes the first electrode layer 210, the barrier layer 220 and the second electrode layer 230.

The first electrode layer 210 can be formed by using the Mo and make contact with the support substrate 100. Among the above elements, the Mo has the thermal expansion coefficient similar to that of the support substrate 100, so the Mo can be efficiently bonded to the support substrate 100, so the back electrode layer 200 may not be delaminated from the support substrate 100.

The barrier layer 220 is formed on the first electrode layer 210. The barrier layer 220 is interposed between the first and second electrode layers 210 and 230 to prevent ions contained in the second electrode layer 230 from diffusing into the first electrode layer 210 and the support substrate 100.

In addition, the barrier layer 220 may serve as a reflective layer. In detail, the barrier layer 220 prevents the light incident into the solar cell from being absorbed in the support substrate 100 and reflects the light toward the light absorbing layer 300, thereby improving the efficiency of the solar cell. The reflective layer may include a material having reflectivity of 50% or above.

The barrier layer 220 may have a thickness in the range of 50 nm to 200 nm. The barrier layer 220 may include nitride, such as TiN or TaN.

The second electrode layer 230 is formed on the barrier layer 220. For instance, the second electrode layer 230 can be formed by using Mo. The second electrode layer 230 can be formed by doping metal ions, for instance, sodium ions.

The sodium ions contained in the second electrode layer 230 may diffuse into the light absorbing layer 300, so that the charge concentration of the light absorbing layer 300 can be increased, thereby improving the photo-electro conversion efficiency of the solar cell.

The sodium ions may diffuse into the support substrate 100 and the first electrode layer 210 as well as the light absorbing layer 300. However, the barrier layer 220 blocks the sodium ions, so the sodium ions can be effectively controlled such that the charge concentration in the light absorbing layer 300 can be effectively increased.

Thus, the open-circuit voltage Voc and the fill factor can be improved. In addition, since the charge concentration in the light absorbing layer 300 can be improved, the loss of the transmitted light can be reduced so that the thickness of the light absorbing layer 300 can be reduced.

The second electrode layer 230 may have a thickness corresponding to 1% to 3% based on a total thickness of the back electrode layer 200, and the back electrode layer 200 may have a thickness of about 1 μm or less.

The light absorbing layer 300 may include group I-III-VI compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 may include group I-III-VI compounds. For instance, the light absorbing layer 300 may include the $Cu(In,Ga)Se_2$ (CIGS) crystal structure, the $Cu(In)Se_2$ crystal structure, or the $Cu(Ga)Se_2$ crystal structure.

The light absorbing layer 300 has an energy bandgap in the range of about 1 eV to about 1.8 eV.

The buffer layer 400 is disposed on the light absorbing layer 300. The buffer layer 400 includes CdS and has an energy bandgap in the range of about 2.2 eV to about 2.4 eV.

The high-resistance buffer layer 500 is disposed on the buffer layer 400. The high-resistance buffer layer 500 may include iZnO, which is zinc oxide not doped with impurities. The high-resistance buffer layer 500 has an energy bandgap in the range of about 3.1 eV to about 3.3 eV.

The window layer 600 is disposed on the high-resistance buffer layer 500. The window layer 600 is a transparent conductive layer. In addition, the window layer 600 has resistance higher than that of the back electrode layer 200.

The window layer 600 includes oxide. For instance, the window layer 600 may include zinc oxide, indium tin oxide (ITO) or indium zinc oxide (IZO).

In addition, the oxide may include conductive dopant, such as Al, $Al_2O_3$, Mg or Ga. In detail, the window layer 60 may include Al doped zinc oxide (AZO) or Ga doped zinc oxide (GZO).

Windows have shapes corresponding to shapes of back electrodes. For instance, the windows are aligned in the form of a stripe pattern. In contrast, the windows can be aligned in the form of a matrix.

As described above, the back electrode layer 200 includes the first electrode layer 210, the barrier layer 220 and the second electrode layer 230 and the sodium ions contained in the second electrode layer 230 are diffused to the light absorbing layer 300 by the barrier layer 220, so the sodium ions can be effectively controlled, thereby increasing the charge concentration in the light absorbing layer 300. In addition, since the loss of the transmitted light can be reduced due to the improvement of the charge concentration in the light absorbing layer 300, the light efficiency can be improved, so that the thickness of the light absorbing layer 300 can be reduced and the productivity can be improved.

FIGS. 2 to 6 are sectional views showing the procedure for manufacturing the solar cell apparatus according to the embodiment. The previous description about the solar cell apparatus will be incorporated herein by reference.

Figure 2:
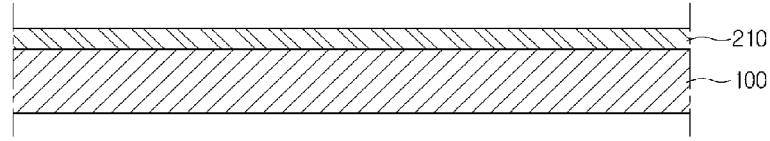
FIGS. 2 to 6 are sectional views showing the procedure for manufacturing a solar cell panel according to the embodiment.
Figure 3:
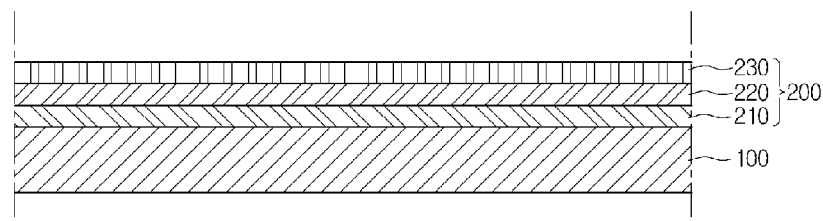

Referring to FIGS. 2 and 3, the first electrode layer 210 is formed on the support substrate 100. The first electrode layer 210 may be deposited by using Mo. The first electrode layer 210 can be formed through a PVD (physical vapor deposition) process or a plating process.

In addition, an additional layer, such as a diffusion barrier layer, can be formed between the support substrate 100 and the first electrode layer 210.

Then, the barrier layer 220 and the second electrode layer 230 are sequentially formed on the first electrode layer 210.

The barrier layer 220 may be formed through the CVD process, but the embodiment is not limited thereto.

The second electrode layer 230 can be deposited by using Mo and metal ions can be doped into the second electrode layer 230 after the second electrode layer 230 has been formed through the PVD process or the plating process.

Figure 4:
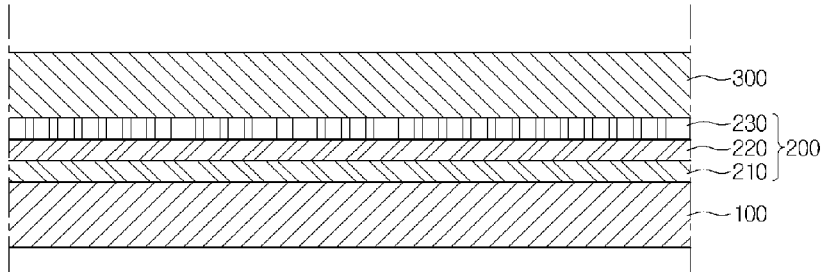

Referring to FIG. 4, the light absorbing layer 300 is formed on the back electrode layer 200.

The light absorbing layer 300 can be formed through the sputtering process or the evaporation process.

For instance, Cu, In, Ga and Se are simultaneously or independently evaporated to form the CIGS-based light absorbing layer 300, or the light absorbing layer 300 can be formed through the selenization process after forming a metal precursor layer.

In detail, the metal precursor layer is formed on the back electrode layer 200 by performing the sputtering process using a Cu target, an In target, and a Ga target.

Then, the selenization process is performed to form the CIGS-based light absorbing layer 300.

In addition, the sputtering process using the Cu target, the In target, and the Ga target and the selenization process can be simultaneously performed.

Further, the CIS-based or CIG-based light absorbing layer 300 can be formed through the selenization process and the sputtering process using only the Cu and In targets or the Cu and Ga targets.

Figure 5:
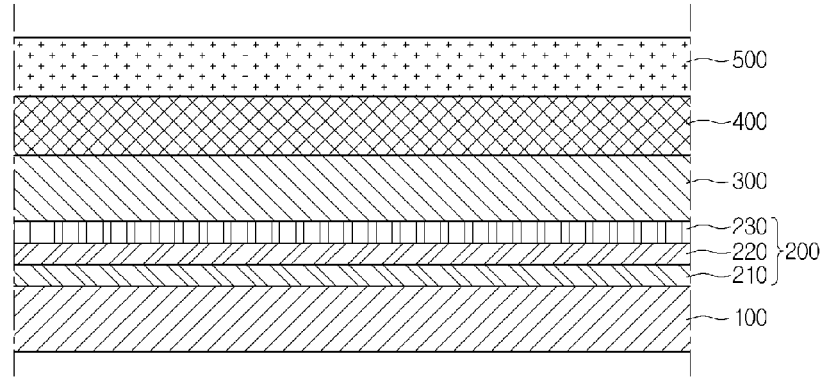

Referring to FIG. 5, the buffer layer 400 and the high-resistance buffer layer 500 are formed on the light absorbing layer 300.

The buffer layer 400 can be formed through the CBD (chemical bath deposition) process. For instance, after the light absorbing layer 300 has been formed, the light absorbing layer 300 is immersed in a solution including materials to form CdS, so that the buffer layer 400 including the CdS is formed on the light absorbing layer 300.

After that, zinc oxide is deposited on the buffer layer 400 through the sputtering process, so that the high-resistance buffer layer 500 is formed.

The buffer layer 400 and the high-resistance buffer layer 500 may have a thin thickness. For instance, the buffer layer 400 and the high-resistance buffer layer 500 may have a thickness in the range of about 1 nm to about 80 nm.

Figure 6:
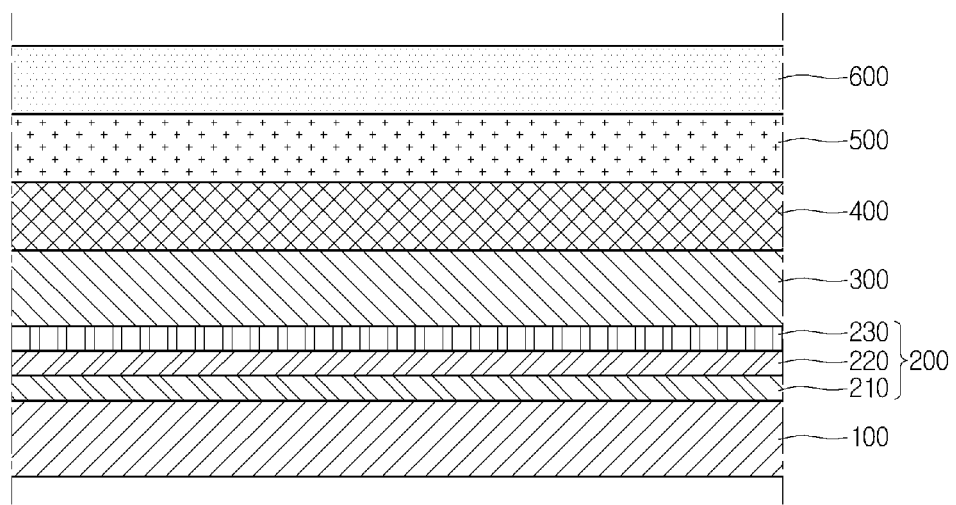

Referring to FIG. 6, the window layer 600 is formed on the high-resistance buffer layer 500. The window layer 600 can be formed by depositing a transparent conductive material on the high-resistance buffer layer 500. For instance, the transparent conductive material includes Al doped zinc oxide, In doped zinc oxide or In doped zinc oxide.

INDUSTRIAL APPLICABILITY

As described above, the solar cell apparatus including the back electrode capable of improving the productivity and reliability can be manufactured through the method for manufacturing the solar cell apparatus according to the embodiment.

Any reference in this specification to one embodiment, an embodiment, example embodiment, etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A solar cell apparatus comprising:
a substrate;
a back electrode layer including molybdenum on the substrate;
a light absorbing layer on the back electrode layer; and
a window layer on the light absorbing layer;
wherein the back electrode layer includes a first electrode layer on the substrate, a barrier layer on the first electrode layer, and a second electrode layer on the barrier layer;
wherein the substrate is soda lime glass,
wherein the first and second electrode layers both include molybdenum,
wherein the second electrode layer includes sodium ions,
wherein the second electrode layer is formed by doping sodium ions,
wherein the second electrode layer has a higher concentration of sodium ions than any other layer of the back electrode layer,
wherein the barrier layer is disposed between the first electrode layer and the second electrode layer, and
wherein the second electrode layer is in direct contact with the light absorbing layer.

2. The solar cell apparatus of claim 1, wherein the barrier layer has a thickness in a range of 50 nm to 200 nm.

3. The solar cell apparatus of claim 1, wherein the barrier layer includes nitride.

4. The solar cell apparatus of claim 1, wherein the second electrode layer has a thickness corresponding to 1% to 30% based on a thickness of the back electrode layer.

5. The solar cell apparatus of claim 3, wherein the nitride includes at least one of TiN and TaN.

6. The solar cell apparatus of claim 1, wherein the back electrode layer has a thickness of 1 μm or less.

* * * * *